United States Patent
Shinozaki

(10) Patent No.: US 7,134,668 B2
(45) Date of Patent: Nov. 14, 2006

(54) DIFFERENTIAL PUMPING SEAL APPARATUS

(75) Inventor: Hiroyuki Shinozaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 2 days.

(21) Appl. No.: 10/278,020

(22) Filed: Oct. 23, 2002

(65) Prior Publication Data

US 2003/0075871 A1    Apr. 24, 2003

(30) Foreign Application Priority Data

Oct. 24, 2001   (JP)   ............................. 2001-326738
Aug. 22, 2002   (JP)   ............................. 2002-241878

(51) Int. Cl.
*F16C 33/74*    (2006.01)
*F16J 15/40*    (2006.01)

(52) U.S. Cl. .................. 277/431; 277/914; 384/15; 384/132

(58) Field of Classification Search ........ 384/130–153, 384/15, 16; 277/409, 411, 422, 431, 433
See application file for complete search history.

(56) References Cited

U.S. PATENT DOCUMENTS

| | | | |
|---|---|---|---|
| 3,610,365 A * | 10/1971 | Maddox et al. ............. | 180/125 |
| 3,635,532 A * | 1/1972 | Zerbola ........................ | 384/12 |
| 3,947,044 A * | 3/1976 | Friedrich ..................... | 277/411 |
| 4,118,042 A | 10/1978 | Booth | |
| 4,191,385 A | 3/1980 | Fox | |
| 4,425,508 A | 1/1984 | Lewis, Jr. | |
| 4,627,362 A * | 12/1986 | Ise et al. .................... | 104/23.2 |
| 5,133,561 A * | 7/1992 | Hattori et al. .............. | 277/646 |
| 5,209,497 A * | 5/1993 | Von Bergen et al. ....... | 277/320 |
| 5,218,896 A * | 6/1993 | Furukawa .................... | 91/419 |
| 6,086,255 A * | 7/2000 | Lyon ............................ | 384/12 |
| 6,126,169 A * | 10/2000 | Sogard et al. .............. | 277/321 |
| 6,402,380 B1 * | 6/2002 | Sogard ......................... | 384/12 |
| 6,443,618 B1 * | 9/2002 | Nishikawa et al. .......... | 384/15 |
| 6,905,123 B1 * | 6/2005 | Goldswain .................. | 277/345 |
| 2003/0015842 A1 * | 1/2003 | Wilhelm ..................... | 277/390 |

FOREIGN PATENT DOCUMENTS

EP    0 067 239 A    12/1982
GB       938 820 A    10/1963

* cited by examiner

*Primary Examiner*—Alison K. Pickard
(74) *Attorney, Agent, or Firm*—Westerman, Hattori, Daniels & Adrian, LLP.

(57) ABSTRACT

A differential pumping seal apparatus includes a differential pumping seal for sealing a first space and a second space from each other in a non-contact manner, and a back up seal mechanism for sealing the first space and the second space from each other in a contact manner. The back up seal mechanism is operated to seal the first space and the second space from each other only when the differential pumping seal is stopped or while operation of said differential pumping seal is stopped.

10 Claims, 11 Drawing Sheets

F I G. 1
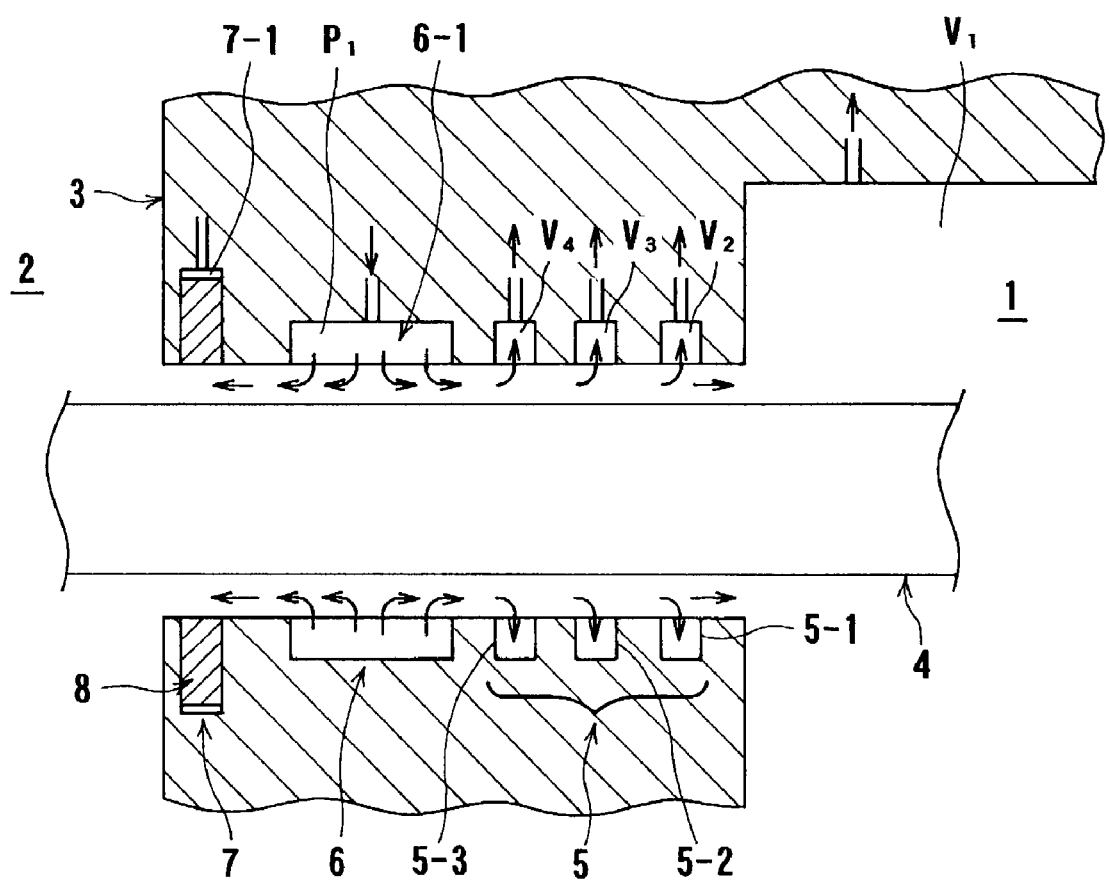

DIFFERENTIAL PUMPING SEAL APPARATUS

BACKGROUND OF THE INVENTION

1. Field of the Invention

The present invention relates to a differential pumping seal apparatus for use as a part of a semiconductor fabrication apparatus or the like, and more particularly to an improved differential pumping seal apparatus having a seal element referred to as a differential pumping seal for sealing a gap between a space defined by a fixed member and a movable body movable with respect to the fixed member, and another space having an atmosphere which is different from an atmosphere in the above space with respect to a pressure, cleanliness, type of a gas, or the like in a non-contact manner.

2. Description of the Related Art

A differential pumping seal is disclosed in U.S. Pat. No. 4,118,042 entitled "Air Bearing Vacuum Seal Assembly", filed in 1977, and U.S. Pat. No. 4,191,385 entitled "Vacuum sealed Gas bearing Assembly", filed in 1979. A differential pumping seal used in a semiconductor fabrication apparatus is disclosed in U.S. Pat. No. 4,425,508 entitled "Electron beam Lithographic Apparatus", filed in 1982.

The conventional differential pumping seal has been used for moving an object quickly and smoothly in a rotary-motion manner or in a linear-motion manner within a clean space such as a vacuum space without contaminating the clean space.

There are at least two cases in which the differential pumping seal is used. In the first case, the differential pumping seal is used in the case where an actuator for moving the object, a guide mechanism for guiding the object, and other components are placed outside of the clean space, and only a minimum structural assembly and the object such as a specimen are adapted to be disposed in the clean space. In the second case, the differential pumping seal is used in the case where a hydrostatic fluid bearing such as an air bearing is used for sealing two spaces from each other without impairing the advantage of a non-contact bearing.

Specifically, in the second case, the differential pumping seal is used for sealing the two spaces from each other in the following situation:

1) The bearing is placed in a clean space, and a space in which a fluid used for the bearing is present and the clean space are sealed from each other.

2) The bearing is placed outside of a clean space, and the clean space and the exterior space of the clean space are sealed from each other.

The differential pumping seal is capable of separating two spaces from each other in a non-contact fashion. This feature is recognized as a great advantage, and the differential pumping seal tends to be applied to practical apparatuses. When the differential pumping seal is in a normal or steady state in which the differential pumping seal functions normally, the differential pumping seal can certainly perform an excellent function as a non-contact seal. However, from a total viewpoint in terms of the reliability and service life of the differential pumping seal, and also cleanliness, it is necessary to sufficiently recognize the effects (features) of the differential pumping seal when the differential pumping seal is in an unsteady state in which the differential pumping seal does not function normally.

When an apparatus having a differential pumping seal is in operation, the failure of a continuous sealing function may occur due to an emergency shutdown of the apparatus, or the entire apparatus including the differential pumping seal may be brought out of operation. When such cases occur, the differential pumping seal has a disadvantage resulted from a non-contact seal. This disadvantage can easily be imagined because an invisible and virtual wall which has separated the two spaces from each other is eliminated when the sealing function is stopped. For example, when operation of the differential pumping seal which has separated a clean space (vacuum space) and a space (the atmosphere) outside of the clean space from each other in a non-contact manner is suddenly stopped, the vacuum space which has been kept clean is instantly filled with air of the atmosphere.

Normally, a substance which has a greatest effect on the degree of vacuum is water, which is typical of moisture of the atmosphere. The humidity in a clean room is normally in the range of about 40 to 55%, and thus a gas in the clean room contains a large quantity of moisture. If air of the atmosphere flows into the clean room each time the differential pumping seal stops its sealing function, then it is difficult to increase the degree of vacuum in a vacuum chamber which is to be cleaned. Further, there is a possibility that particles in the atmosphere outside of the vacuum chamber enter the vacuum chamber. In an apparatus having an ordinary vacuum chamber, no atmosphere is introduced into the vacuum chamber, and the humidity of a gas which is introduced into the vacuum chamber is controlled at an extremely low degree.

When the differential pumping seal stops its sealing function in a non-contact manner, the vacuum chamber is the same as a vacuum chamber whose partition wall for separating the vacuum chamber from the exterior has a large crack. Therefore, the differential pumping seal is, so to speak, a troublesome apparatus from the standpoint of the commonsense in the field of the conventional vacuum apparatus.

As described above, the conventional differential pumping seal (non-contact seal) has an operational disadvantage in an apparatus incorporating the differential pumping seal such as a vacuum apparatus which requires a cleanliness of an atmosphere.

In order to apply a non-contact seal to a semiconductor fabrication apparatus in practical use, it is necessary to compensate for the above operational disadvantage by adding other element.

SUMMARY OF THE INVENTION

The present invention has been made in view of the above drawbacks. It is an object of the present invention to provide a differential pumping seal apparatus which can eliminate the disadvantage of a conventional differential pumping seal serving as a non-contact seal, and can maintain a space sealed by the differential pumping seal in a state before operation of the differential pumping seal is stopped, e.g., can maintain a clean space in a clean state, even when operation of the differential pumping seal is stopped or while operation of the differential pumping seal is stopped.

Another object of the present invention is to provide a differential pumping seal apparatus having a differential pumping seal for sealing a gap between two spaces whose atmospheres are different from each other, specifically, a differential pumping seal apparatus having a diaphragm seal member which does not function when the differential pumping seal functions normally and is in a stable state, and which functions when the differential pumping seal does not function normally and is in an unstable state in such a manner that the diaphragm seal member is brought into contact with a member defining the gap by a fluid pressure for thereby interrupting the communication between the two spaces.

Still another object of the present invention is to provide a differential pumping seal apparatus having a differential pumping seal for sealing a gap between two spaces whose atmospheres are different from each other, specifically, a differential pumping seal apparatus having a seal member which does not function when the differential pumping seal functions normally and is in a stable state, and which functions when the differential pumping seal does not function normally and is in an unstable state in such a manner that one of two members which define the gap is pushed toward the other member by a pushing means to bring the one of the two members into contact with a seal member for thereby interrupting the communication between the two spaces.

In order to achieve the above object, according to a first aspect of the present invention, there is provided a differential pumping seal apparatus comprising: a differential pumping seal for sealing a first space and a second space from each other in a non-contact manner; and a back up seal mechanism for sealing the first space and the second space from each other in a contact manner; wherein the back up seal mechanism seals the first space and the second space from each other only when operation of the differential pumping seal is stopped or while operation of the differential pumping seal is stopped.

According to the present invention, since the back up seal mechanism is provided for sealing the first space and the second space from each other only when operation of the differential pumping seal is stopped or while operation of the differential pumping seal is stopped, the first space and the second space can be maintained in a state which is substantially the same as a state which is achieved when the differential pumping seal is in operation even when operation of the differential pumping seal is stopped or while operation of the differential pumping seal is stopped.

In a preferred aspect of the present invention, the back up seal mechanism comprises a seal member for sealing the first space and the second space from each other, and the seal member is kept in a non-contact state by the force of a fluid or an external force so as not to perform the sealing function thereof when the differential pumping seal is in operation, and the seal member is kept in a contact state by its own elasticity or an external force so as to perform the sealing function thereof when the differential pumping seal is not in operation.

According to the present invention, since the seal member is kept in a non-contact state by the force of the fluid or the external force so as not to exercise the sealing function thereof when the differential pumping seal is in operation, and the seal member is kept in a contact state by its own elasticity or the external force to exercise the sealing function thereof when the differential pumping seal is not in operation, the structure of the back up seal can be simplified.

According to a second aspect of the present invention, there is provided a differential pumping seal apparatus comprising: a partition wall for dividing a first space and a second space from each other; a movable body provided so as to pass through the partition wall; a differential pumping seal for sealing the first space and the second space from each other in a non-contact manner; and a back up seal mechanism for closing a gap between the partition wall and the movable body in a contact manner so as to seal the first space and the second space from each other; wherein the back up seal mechanism seals the first space and the second space from each other only when operation of the differential pumping seal is stopped or while operation of the differential pumping seal is stopped.

According to the present invention, since the back up seal mechanism is provided for sealing the first space and the second space from each other only when operation of the differential pumping seal is stopped or while operation of the differential pumping seal is stopped, the first space and the second space can be maintained in a state which is substantially the same as a state which is achieved when the differential pumping seal is in operation even when operation of the differential pumping seal is stopped or while operation of the differential pumping seal is stopped.

In a preferred aspect of the present invention, the back up seal mechanism has a shutter mechanism for opening and closing the gap between the partition wall and the movable body, and the shutter mechanism is operated to seal the first space and the second space from each other only when operation of the differential pumping seal is stopped or while operation of the differential pumping seal is stopped.

With this arrangement, since the back up seal mechanism has the shutter mechanism for closing the gap between the partition wall and the movable body only when operation of the differential pumping seal is stopped or while operation of the differential pumping seal is stopped, the structure of the back up seal mechanism can be simplified.

In a preferred aspect of the present, the back up seal mechanism has a seal member provided on the partition wall or the movable body, and the seal member is brought into contact with the partition wall or the movable body by its own elasticity so as to perform a sealing function thereof when the differential pumping seal is not in operation, and the seal member is kept out of contact with the partition wall or the movable body by the force of a fluid so as not to perform the sealing function thereof when the differential pumping seal is in operation.

With this arrangement, the seal member is brought into contact with the partition wall or the movable body by its own elasticity so as to perform a sealing function thereof when the differential pumping seal is not in operation, and the seal member is kept out of contact with the partition wall or the movable body by the force of a fluid so as not to exercise the sealing function thereof when the differential pumping seal is in operation. Thus, there is no need to provide a special operating means for operating the back up seal mechanism, and hence the structure of the back up seal mechanism can be simplified.

According to a third aspect of the present invention, there is provided a differential pumping seal apparatus comprising: a first member for defining at least one of a first space and a second space whose atmospheres are different from each other; a second member movable relatively to the first member; a differential pumping seal for sealing a gap between the first space and the second space in a non-contact manner; and a seal element for separating the first space and the second space from each other in a contact manner only when the differential pumping seal does not function; wherein the seal element comprises a diaphragm seal member which is extensible and has an edge portion fixed to the first member, and the diaphragm seal member projects toward the second member by a fluid pressure so as to be brought into contact with the second member.

According to the present invention, the communication between the first and second spaces can effectively be interrupted by the seal element even when the differential pumping seal does not function. The diaphragm seal member has a structure capable of performing its function without being supplied with energy when its sealing function is to be performed, and can keep its sealing function in a contact state (a state with a low energy level).

In a preferred aspect of the present invention, the gap is formed on both sides of the first space, and the differential pumping seal for sealing the gap is provided at a position where the second member passes through the first member.

According to a fourth aspect of the present invention, there is provided a differential pumping seal apparatus comprising: a first member for defining at least one of a first space and a second space whose atmospheres are different from each other; a second member movable relatively to the first member; a differential pumping seal for sealing a gap between the first space and the second space in a non-contact manner, the gap being formed only on one side of the second member, one of the first and second spaces being defined by the first member and the second member; a seal element for separating the first space and the second space from each other in a contact manner only when the differential pumping seal does not function, the seal element comprising a fixed seal member which is fixed to the first member and is capable of being brought into contact with the second member; and a push device for pushing the second member toward the first member to bring the second member into contact with the fixed seal member only when the differential pumping seal does not function.

According to the present invention, the communication between the first and second spaces can effectively be interrupted by the seal element even when the differential pumping seal does not function. The fixed seal member has a structure capable of performing its function without being supplied with energy when its sealing function is to be performed, and can keep its sealing function in a contact state (a state with a low energy level).

In a preferred aspect of the present invention, the differential pumping seal apparatus further comprises a hydrostatic bearing which performs the bearing function in the gap; the hydrostatic bearing and the differential pumping seal being adjacent to each other in the gap, the hydrostatic bearing being disposed at a position where the hydrostatic bearing is closer to the second space than the differential pumping seal, and the seal element being disposed between the hydrostatic bearing and the second space.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 1 is a schematic view showing a differential pumping seal apparatus according to a first embodiment of the present invention;

DETAILED DESCRIPTION OF THE PREFERRED EMBODIMENTS

Figure 2:
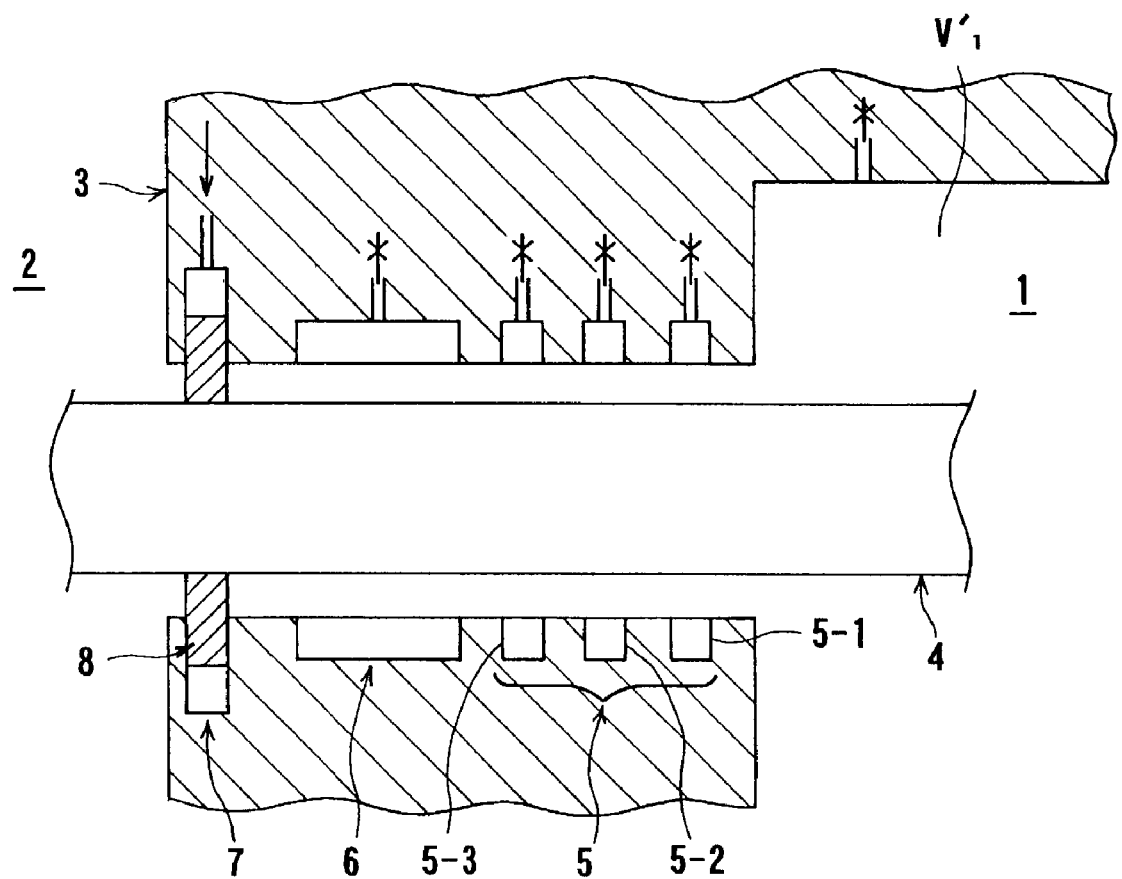
FIG. 2 is a schematic view showing the differential pumping seal apparatus according to the first embodiment of the present invention.

A differential pumping seal apparatus according to embodiments of the present invention will be described below with reference to the drawings. A differential pumping seal apparatus having a differential pumping seal and a hydrostatic bearing according to a first embodiment of the present invention will be described with reference to FIGS. 1 and 2. In FIGS. 1 and 2, the differential pumping seal and the hydrostatic bearing are illustrated in a simplified manner so as to be easily understood. As shown in FIGS. 1 and 2, a partition wall 3 is disposed between a clean space region 1 serving as a first space and an atmospheric region 2 serving as a second space. A movable body 4 is provided so as to pass through the partition wall 3. An actuator (not shown) is disposed in the atmospheric region 2 and is coupled to the movable body 4. An object such as a specimen (not shown) which is disposed in the clean space region 1 can be moved by the movable body 4.

The differential pumping seal apparatus comprises a differential pumping seal 5 for separating the clean space region 1 and the atmospheric region 2 from each other, and a hydrostatic bearing 6 for supporting the movable body 4 in a non-contact manner. The differential pumping seal 5 and the hydrostatic bearing 6 allow the movable body 4 to move smoothly without being subjected to a sliding resistance. The differential pumping seal 5 has a plurality of pump grooves 5-1, 5-2 and 5-3 having respective pump ports connected to an evacuating system via valves (not shown).

While the differential pumping seal 5 is in operation, a working fluid supply port 6-1 of the hydrostatic bearing 6 communicates with a working fluid supply source via a valve (not shown), and a working fluid is supplied from the working fluid supply source to the working fluid supply port 6-1 which is then kept at a pressure of P1. Pump ports of the respective pump grooves 5-1, 5-2 and 5-3 of the differential pumping seal 5 communicate with the evacuating system, so that the pump ports are kept at pressures of V2, V3 and V4, respectively. Further, the clean space region 1 communicates with the evacuating system via a valve (not shown), and the clean space region 1 is kept at a pressure of V1.

A back up seal mechanism 7 is disposed on the partition wall 3 at a position near the atmospheric region 2. The back up seal mechanism is operated when the differential pumping seal 5 is not in operation, i.e., is not in a normal or stable state. The back up seal mechanism 7 has a seal member 8 movable into and out of the surface of the partition wall 3 which faces the movable body 4. FIG. 1 shows the differential pumping seal 5 which is in operation, and FIG. 2 shows the differential pumping seal 5 which is not in operation. While the differential pumping seal 5 is in operation, the working fluid discharged from the hydrostatic bearing 6 flows toward the atmospheric region 2 and also toward the differential pumping seal 5, as indicated by the arrows in FIG. 1. The working fluid which has flowed toward the differential pumping seal 5 is successively evacuated from the pump grooves 5-3, 5-2 and 5-1, and only a trace amount of the working fluid flows into the clean space region 1.

Although not shown in the drawing, the pump groove 5-1 positioned near the clean space region 1 among the three pump grooves 5-1, 5-2 and 5-3 may be used as a purge gas port for supplying a purge gas. While the differential pumping seal 5 shown in FIG. 1 is in operation, the clean space region 1 and the atmospheric region 2 are separated from each other by a non-visible and virtual wall (non-contact seal, i.e. differential pumping seal).

While the differential pumping seal 5 is not in operation, the pump ports of the respective pump grooves 5-1, 5-2 and 5-3 are disconnected from the evacuating system by the respective non-illustrated valves. The working fluid supply port 6-1 of the hydrostatic bearing 6 is disconnected from the working fluid supply source by the non-illustrated valve. Further, the clean space region 1 is disconnected from the evacuating system by the non-illustrated valve. At this time, the working fluid is supplied to a working fluid supply port 7-1 of the back up seal mechanism 7. As a result, the seal member 8 projects from the surface of the partition wall 3 and an end portion of the seal member 8 is brought into close contact with the movable body 4, thereby starting to perform the sealing function by which the clean space region 1 and the atmospheric region 2 are separated from each other. In this case, although the pressure V1 in the clean space region 1 is slightly raised, the clean space region 1 is kept at a pressure of V1' (V1<V1').

After the sealing member 8 of the back up seal mechanism 7 starts to perform its sealing function when operation of the differential pumping seal 5 is stopped, the clean space region 1 may be filled with a highly clean gas.

Figure 3A:
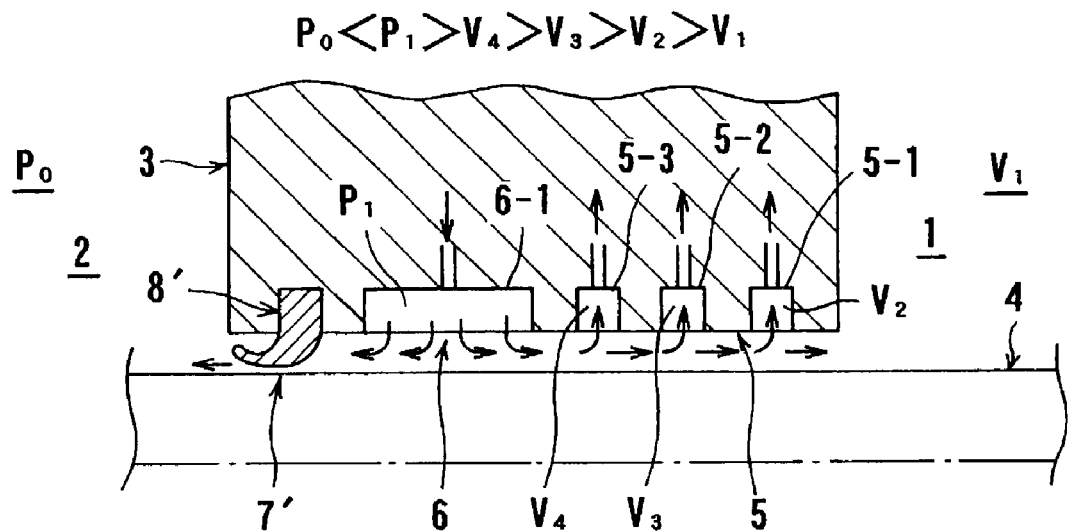
FIG. 3A is a schematic view illustrating a differential pumping seal apparatus which is in operation according to a second embodiment of the present invention.
Figure 3B:
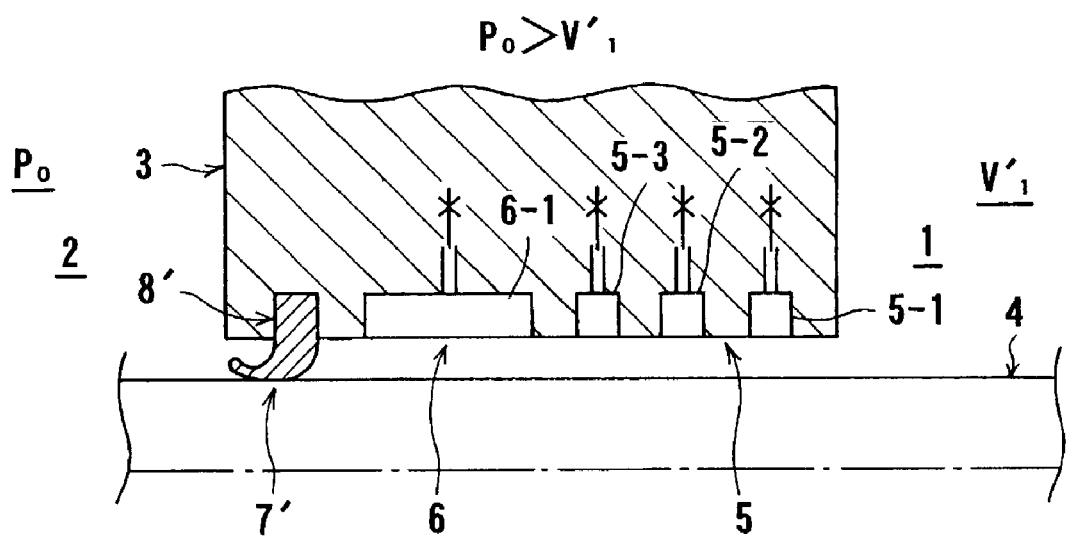
FIG. 3B is a schematic view illustrating a differential pumping seal apparatus which is not in operation according to the second embodiment of the present invention.

FIGS. 3A and 3B are views illustrating the manner in which a differential pumping seal apparatus having a differential pumping seal and a hydrostatic bearing according to a second embodiment of the present invention is operated. FIG. 3A shows the differential pumping seal which is in operation, and FIG. 3B shows the differential pumping seal which is not in operation. In FIGS. 3A and 3B, reference numeral 8' represents a seal member of a back up seal mechanism 7'. The seal member 8' is made of an elastic material and has a thin lip on its tip end.

While the differential pumping seal 5 is in operation, i.e., while the working fluid discharged from the hydrostatic bearing 6 flows toward the atmospheric region 2 and the differential pumping seal 5 as indicated by the arrows in FIG. 3A, if the relationship among the pressure V1 in the clean space region 1, the pressure P0 in the atmospheric region 2, the pressure P1 in the working fluid supply port 6-1, and the pressures V2, V3 and V4 in the respective pump ports of the pump grooves 5-1, 5-2 and 5-3 is P0<P1>V4>V3>V2>V1, then the tip end (lip) of the seal member 8' of the back up seal mechanism 7' is brought out of contact with the movable body 4 by the force of the working fluid discharged from the hydrostatic bearing 6. That is, the sealing function of the back up seal mechanism 7' is not exercised.

While the differential pumping seal 5 is not in operation, i.e., while the working fluid is not discharged from the hydrostatic bearing 6 (being disconnected from the working fluid supply source), if the relationship between the pressure P0 in the atmospheric region 2 and the pressure V1' in the clean space region 1 is P0>V1', then the tip end (lip) of the seal member 8' of the back up seal mechanism 7' is brought into close contact with the movable body 4. Specifically, since the force applied to the seal member 8' by a flow of the working fluid discharged from the hydrostatic bearing 6 is eliminated, the tip end (lip) of the seal member 8' is brought into close contact with the movable body 4 under its own elasticity. The atmosphere in the atmospheric region 2 is thus prevented from flowing into the clean space region 1. The seal member 8' is made of resin or rubber containing fluorine.

Figure 4A:
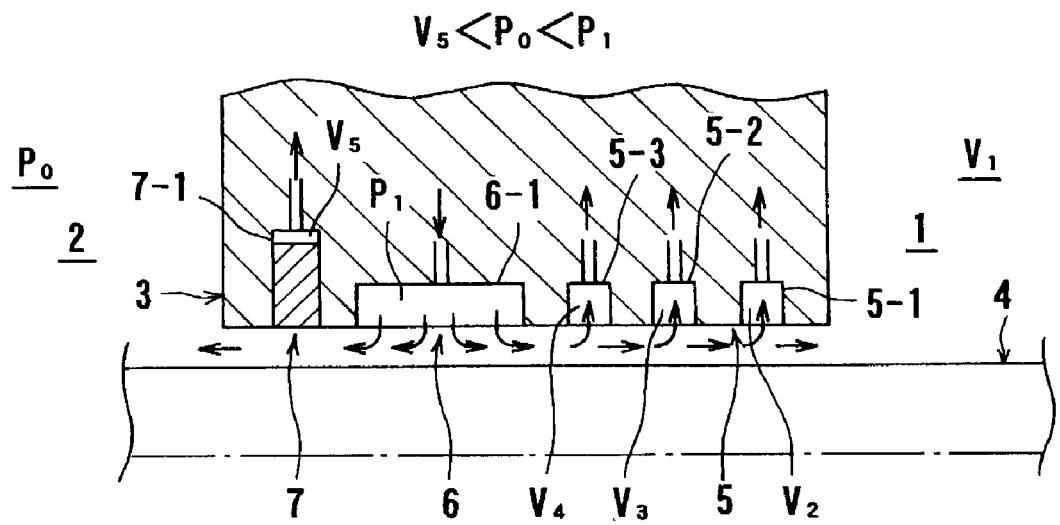
FIG. 4A is a schematic view illustrating the differential pumping seal apparatus which is in operation according to the first embodiment of the present invention.
Figure 4B:
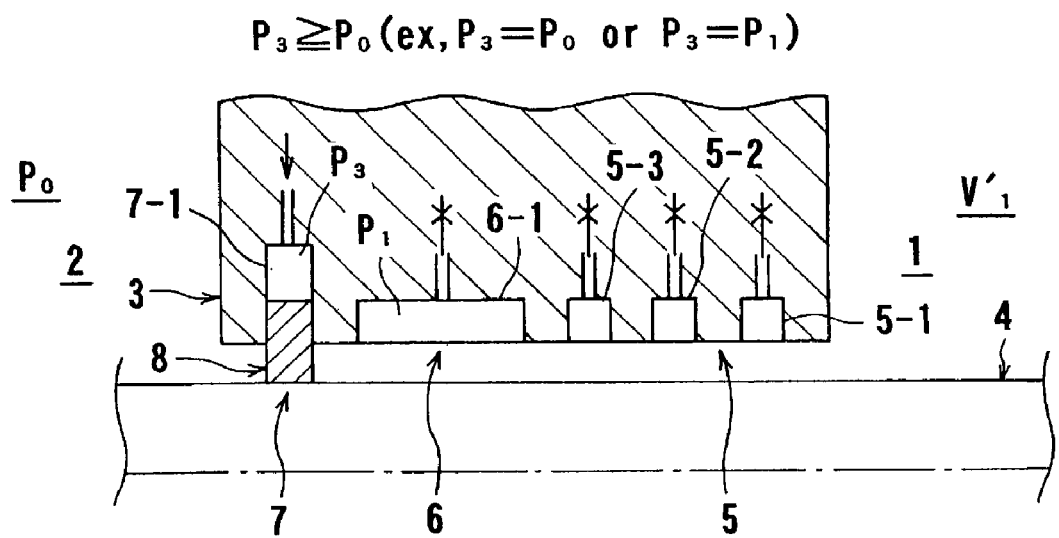
FIG. 4B is a schematic view illustrating the differential pumping seal apparatus which is not in operation according to the first embodiment of the present invention.

FIGS. 4A and 4B are views showing the manner in which the differential pumping seal apparatus having the differential pumping seal and the hydrostatic bearing according to the first embodiment of the present invention is operated. FIG. 4A shows the differential pumping seal 5 which is in operation, and FIG. 4B shows the differential pumping seal 5 which is not in operation. In FIGS. 4A and 4B, reference numeral 8 represents the seal member of the back up seal mechanism 7, as described above. The seal member 8 is movable into and out of the working fluid supply port 7-1 defined in the surface of the partition wall 3 which faces the movable body 4. When the working fluid supply port 7-1 communicates with the evacuating system via the valve (not shown), the seal member 8 is retracted (housed) into the working fluid supply port 7-1, as shown in FIG. 4A. When the working fluid supply port 7-1 communicates with the working fluid supply source via a valve (not shown) and the working fluid is supplied from the working fluid supply source to the working fluid supply port 7-1, the seal member 8 projects from the working fluid supply port 7-1 and is brought into close contact with the movable body 4.

When the differential pumping seal 5 is in operation, and is in a normal or stable state, the working fluid supply port 7-1 of the back up seal mechanism 7 communicates with the evacuating system so that a pressure of V5 is developed in the working fluid supply port 7-1, thus retracting (housing) the seal member 8 into the working fluid supply port 7-1. The working fluid supply port 7-1 may be connected to the evacuating system which develops a pressure of V4 in the pump groove 5-3 of the differential pumping seal 5. At this time, the relationship among the pressure V5 in the working fluid supply port 7-1, the pressure P0 in the atmospheric region 2, and the pressure P1 in the working fluid supply port 6-1 of the hydrostatic bearing 6 is V5<P0<P1.

When the differential pumping seal 5 is not in the normal state, and is not in operation, the working fluid supply port 7-1 is supplied with the working fluid so as to develop a pressure of P3 (P3>P0) therein, thus projecting the seal member 8 from the working fluid supply port 7-1 and bringing the tip end of the seal member 8 into close contact with the movable body 4. In this case, a pressure developed in the working fluid supply port 7-1 may be set to be equal to the pressure P0 in the atmospheric region 2 (P3=$P_0$) for thereby allowing the seal member 8 to project. Alternatively, the working fluid supply port 7-1 may be connected via a directional-control valve (not shown) to the working fluid supply source which supplies the working fluid to the working fluid supply port 6-1 of the hydrostatic bearing 6, and the directional-control valve may be operated to supply the working fluid from the working fluid supply source to the working fluid supply port 7-1 for thereby allowing the seal member 8 to project.

In terms of the response to be achieved when the back up seal mechanism 7 starts to perform its sealing function, it is preferable to operate the directional-control valve to switch the supply of the working fluid from the working fluid supply source from the working fluid supply port 6-1 to the working fluid supply port 7-1 for thereby projecting the seal member 8. The seal member 8 is made of resin or rubber containing fluorine.

In the illustrated embodiment, the differential pumping seal apparatus comprises the partition wall 3 which is disposed between the clean space region 1 and the atmospheric region 2, the movable body 4 which is provided so as to pass through the partition wall 3, and the hydrostatic bearing 6 for supporting the movable body 4. However, the present invention is also applicable to a pumping seal apparatus which has a differential pumping seal for sealing the clean space region 1 and the atmospheric region 2 from each other in a non-contact fashion, even if the differential pumping seal apparatus does not have the partition wall 3, the movable body 4, and the hydrostatic bearing 6.

As described above, according to the present invention, the following excellent effects can be obtained:

1) Because the back up seal mechanism is provided for sealing the first space and the second space from each other only when operation of the differential pumping seal is stopped or while operation of the differential pumping seal is stopped, the first space and the second space can be maintained in a state which is substantially the same as a state which is achieved when the differential pumping seal is in operation even when operation of the differential pumping seal is stopped or while operation of the differential pumping seal is stopped.

2) Because the seal member is kept in a non-contact state by the force of the fluid or the external force so as not to exercise a sealing function thereof when the differential pumping seal is in operation, and the seal member is kept in a contact state by its own elasticity or the external force to exercise the sealing function thereof when the differential pumping seal is not in operation, the structure of the back up seal can be simplified.

3) Because the back up seal mechanism is provided for sealing the first space and the second space from each other only when operation of the differential pumping seal is stopped or while operation of the differential pumping seal is stopped, the first space and the second space can be maintained in a state which is substantially the same as a state which is achieved when the differential pumping seal is in operation even when operation of the differential pumping seal is stopped or while operation of the differential pumping seal is stopped.

4) Because the back up seal mechanism has the shutter mechanism for closing the gap between the partition wall and the movable body only when operation of the differential pumping seal is stopped or while operation of the differential pumping seal is stopped, the structure of the back up seal mechanism can be simplified.

5) The seal member is brought into contact with the partition wall or the movable body by its own elasticity so as to exercise the sealing function thereof when the differential pumping seal is not in operation, and the seal member is kept out of contact with the partition wall or the movable body by the force of a fluid so as not to exercise the sealing function thereof when the differential pumping seal is in operation. Thus, there is no need to provide a special operating device for operating the back up seal mechanism, and hence the structure of the back up seal mechanism can be simplified.

A differential pumping seal apparatus according to a third embodiment of the present invention will be described below with reference to FIGS. 5 through 7. In this embodiment, the differential pumping seal apparatus having a differential pumping seal and a hydrostatic bearing will be described below with reference to simplified drawings.

Figure 5:
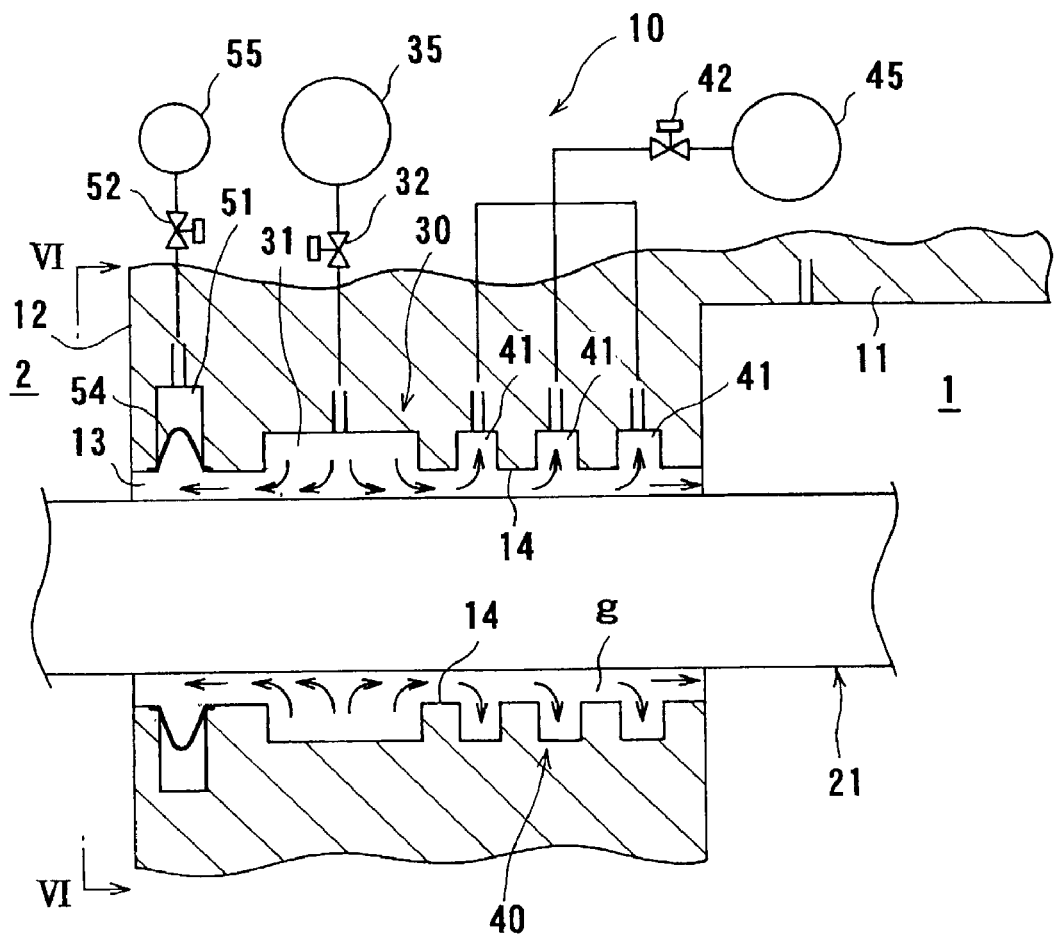
FIG. 5 is a partially cross-sectional view showing a differential pumping seal apparatus according to a third embodiment of the present invention.
Figure 6:
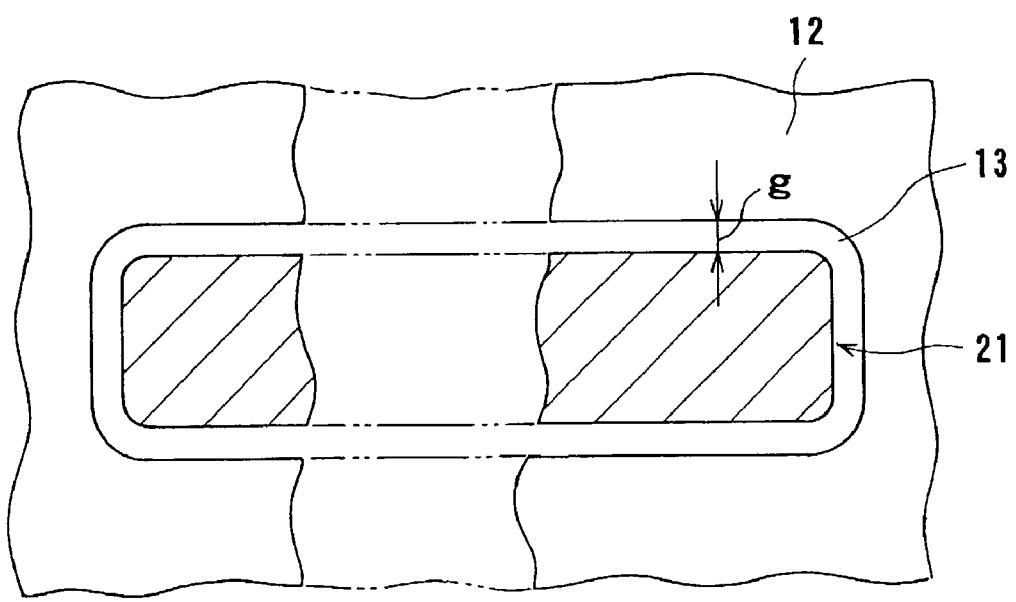
FIG. 6 is a view as viewed from line VI-VI of FIG. 5.
Figure 7:
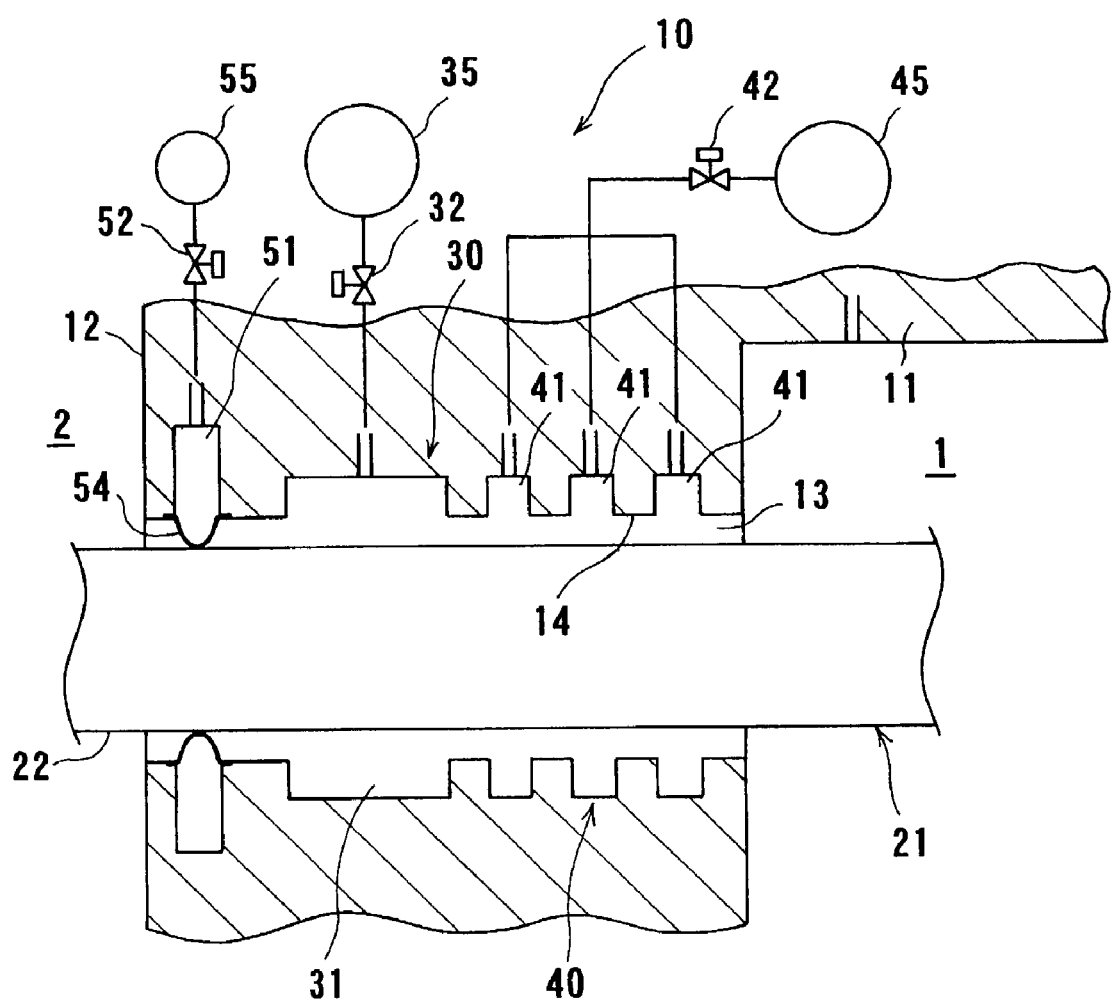
FIG. 7 is a partially cross-sectional view showing a different operational state of the differential pumping seal apparatus shown in FIG. 5.

In FIGS. 5 through 7, reference numeral 10 represents the entire structure of the differential pumping seal apparatus, and reference numeral 11 represents a first member which defines a first space 1 serving as a clean space. An outer peripheral side of the first member 11 (shown at the left side in FIG. 5) faces a second space, e.g., a second space 2 which is at atmospheric pressure. The atmosphere in the second space 2 is different from the atmosphere in the first space 1 (in terms of a pressure, cleanliness, type of a filled gas, and the like). A side wall 12 of the first member 11 has a passage 13 which passes therethrough, and the first space 1 and the second space 2 which are defined by the first member 11 communicate with each other through the passage 13. A second member 21 is disposed in the passage 13 so as to pass through the passage 13. The first member 11 may be a housing which defines the first space 1 (e.g., a vacuum chamber), and the second member 21 may be a slider capable of moving linearly relatively to the housing (in FIGS. 5 and 6). Therefore, hereinafter, the first member will be described as a housing, and the second member as a slider. In this embodiment, the slider 21 has a rectangular cross section, and hence the passage 13 which accommodates the slider 21 also has a rectangular cross section. A gap "g" having a desired dimension ranging, for example, from about 5 to 50 μm is defined between the slider 21 and the housing 11, so that the slider 21 can be moved without contacting the housing 11. The gap "g" is formed on both sides of the housing 11.

The housing 11 has an inner surface 14 defining the passage 13, and a groove 31 which provides a hydrostatic bearing 30 is formed in the inner surface 14 at a position near the second space 2. The groove 31 extends in a circumferential direction of the passage 13 in such a manner that the groove 31 fully surrounds the slider 21. In FIGS. 5 and 6, only upper and lower portions of the groove 31 formed in the inner surface 14 are shown. The groove 31 is connected to a supply source 35 for supplying clean air or a clean inert gas via a valve 32, and hence the clean air or the clean inert gas can be supplied from the supply source 35 into the groove 31. A plurality of grooves 41 (three in the present embodiment) which provide a differential pumping seal 40 is formed in the inner surface 14 at a position between the groove 31 and the first space 1. The grooves 41 serving as the differential pumping seal 40 are provided at a position where the slider 21 passes through the housing 11. The grooves 41 also extend in a circumferential direction of the passage 13 in such a manner that the grooves 41 fully surround the slider 21. In FIGS. 5 and 6, only upper and lower portions of the grooves 41 formed in the inner surface 14 are shown. The grooves 41 are connected to a vacuum source 45 such as a vacuum container or a vacuum pump via a valve 42, and thus a gas flowing through the gap "g" is evacuated from the grooves 41 by the vacuum source 45.

The inner surface 14 of the passage 13 further has a groove 51 positioned between the groove 31 of the hydrostatic bearing 30 and the second space 2. The groove 51 also extends in a circumferential direction of the passage 13 in such a manner that the groove 51 fully surrounds the slider 21. The groove 51 is connected to a supply source 55 for supplying a fluid such as a gas or a liquid via a valve 52, and hence the gas or the liquid can be supplied from the supply source 55 into the groove 51. A diaphragm seal member 54 having a substantially U-shaped or V-shaped cross section is disposed in the groove 51, and both side edges of the diaphragm seal member 54 are fixed to an open end of the groove 51 by a known means. When no fluid is supplied into the groove 51, the diaphragm seal member 54 is retracted into the groove 51, as shown in FIG. 5. The diaphragm seal member 54 is made of resin or rubber containing fluorine, silicon, or butyl acetate.

The slider 21 is linearly movable in the horizontal direction (to the left or right in FIGS. 5 and 7) in a reciprocating manner by an actuating mechanism (not shown) disposed in the second space 2 under atmospheric pressure. A specimen or the like placed in the first space 1 can be thus moved by the slider 21.

When the valve 32 is opened to supply the clean air or the clean inert gas from the supply source 35 into the groove 31 of the hydrostatic bearing 30, the clean air or the clean inert gas flows from the groove 31 into the gap "g", thus supporting the slider 21 out of contact with the housing 11 in a non-contact manner. Therefore, the slider 21 can smoothly be reciprocated by the non-illustrated actuating mechanism without contacting the housing 11. Most of the clean air or the clean inert gas which has flowed into the gap "g" flows from the grooves 41 of the differential pumping seal 40 into the vacuum source 45 via the valve 42, and part of the remaining clean air or the remaining clean inert gas flows into the second space 2 under atmospheric pressure. Therefore, only a trace amount of the clean air or the clean inert gas flows into the first space 1 which serves as a clean space. In this manner, the first space 1 and the second space 2 are separated from each other by an invisible wall (a non-contact seal, i.e. a differential pumping seal).

In the present embodiment, one of the three grooves 41 which is close to the first space 1 may be used as a purge gas port for supplying a purge gas, instead of being used as a groove for discharging the clean air or the clean inert gas.

When the valve 32 of the hydrostatic bearing 30 is closed and the supply of the clean air or the clean inert gas into the groove 31 is stopped or has been stopped, the valve 42 of the differential pumping seal apparatus 40 is closed to stop evacuating the clean air or the clean inert gas in the gap "g" from the grooves 41. At the same time that or immediately after the valve 42 is closed, the valve 52 is opened and the fluid is introduced from the supply source 55 into the groove 51. Therefore, as shown in FIG. 7, the diaphragm seal member 54 is deformed in such a manner that a central portion of the diaphragm seal member 54 projects from the groove 51, and is brought into contact with an outer surface 22 of the slider 21. Consequently, the communication between the first space 1 and the second space 2 through the gap "g" is interrupted by the seal member 54. The degree of vacuum or the degree of cleanliness in the second space 2 is slightly lowered from the level that is achieved when the differential pumping seal 40 is in operation, but is not lowered enough to obstruct the operation of an apparatus having the differential pumping seal apparatus. After the communication between the first space 1 and the second space 2 is interrupted by the seal member 54, a highly clean gas may be introduced into the first space 1.

In the above embodiment, each of the slider 21 and the passage 13 has a rectangular cross section. However, each of the slider 21 and the passage 13 may have a circular or oval cross section.

FIGS. 8 through 11 show a differential pumping seal apparatus according to a fourth embodiment of the present invention. Those parts of the differential pumping seal apparatus according to the fourth embodiment which are identical to those of the differential pumping seal apparatus according to the third embodiment are denoted by identical reference numerals with a suffix "a". Structurally and functionally identical parts will not be described in detail below, but only different parts will be described below.

In FIGS. 8 through 11, reference numerals 11$a$ and 11$a'$ represent a first member which serves as a housing defining a first space 1 capable of constituting a clean space, and reference numeral 21$a$ represents a second member which serves as a slider capable of moving (to the left and right in FIG. 8) relatively to the housings 11$a$ and 11$a'$. The differential pumping seal apparatus according the present embodiment comprises two housings 11$a$ and 11$a'$. The housing 11$a$ is disposed above the slider 21$a$, and the housing 11$a'$ is disposed below the slider 21$a$. An outer peripheral side of the housing 11$a$ and 11$a'$ (shown at the left side in FIG. 8) faces a second space, e.g., a space 2 which is at atmospheric pressure, and the atmosphere in the space 2 is different from the atmosphere in the first space 1 (in terms of a pressure, cleanliness, type of a filled gas, and the like).

A hydrostatic bearing and a differential pumping seal which are disposed between the housing 11$a$ and the slider 21$a$, and a hydrostatic bearing and a differential pumping seal which are disposed between the housing 11$a'$ and the slider 21$a$ are essentially identical in structure to each other. Therefore, only the hydrostatic bearing and the differential pumping seal disposed between the housing 11$a$ and the slider 21$a$ will be described below.

In the present embodiment, the housing 11$a$ has a side wall 12$a$ extending annularly (rectangularly in the case where the housing has a rectangular shape, and circularly in the case where the housing has a circular shape) in such a manner that the side wall 12$a$ surrounds the first space 1 above the slider 21$a$. The side wall 12$a$ has a lower surface 14$a$ spaced from the slider 21$a$ by a desired distance over the outer surface of the slider 21$a$, and a gap "g" between the lower surface 14$a$ and the slider 21$a$ having a desired dimension, e.g., in the range from about 5 to 50 µm is formed, so that the slider 21$a$ can be moved without contacting the housing 11$a$.

Figure 8:
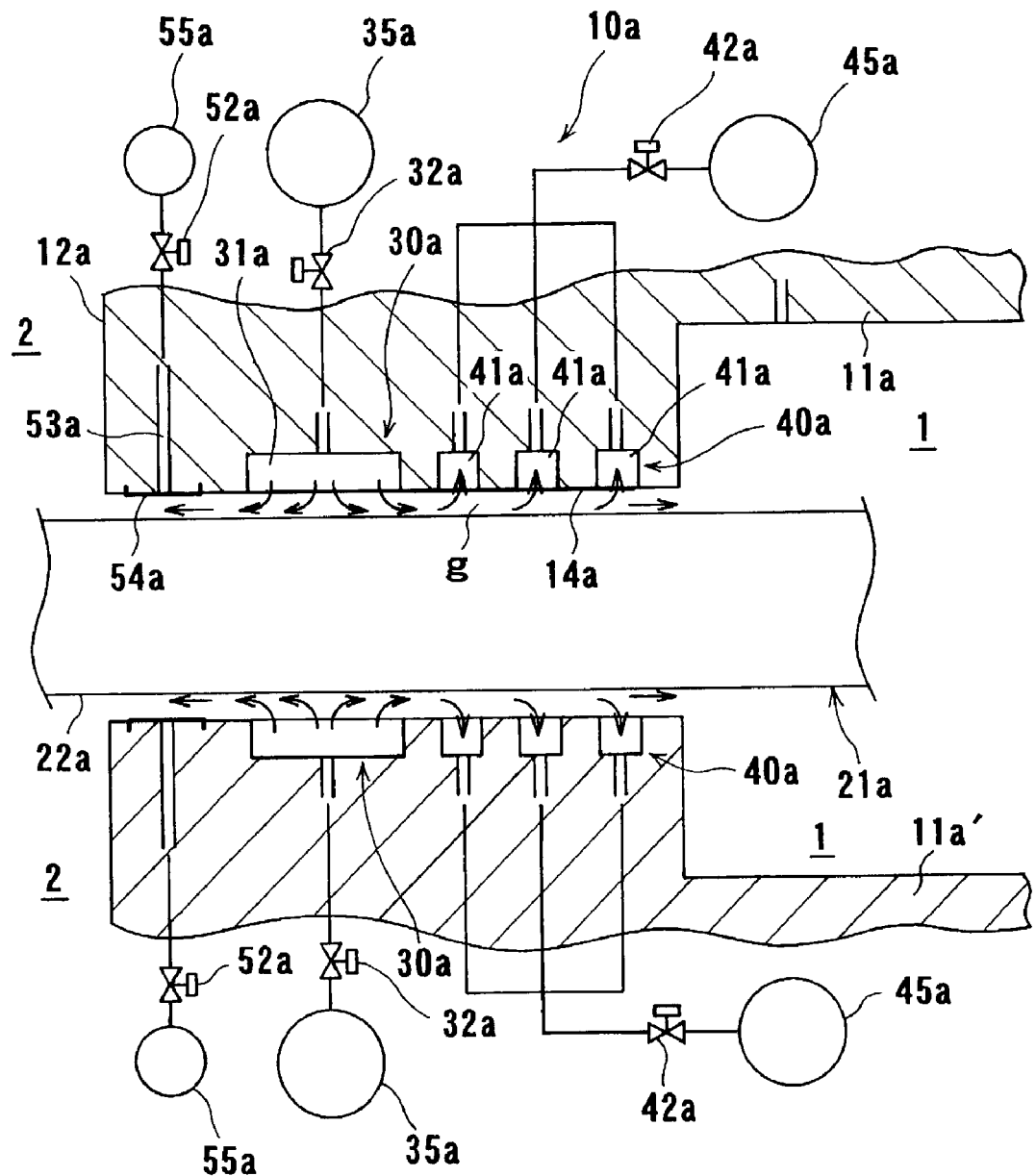
FIG. 8 is a partially cross-sectional view showing a differential pumping seal apparatus according to a fourth embodiment of the present invention.
Figure 9:
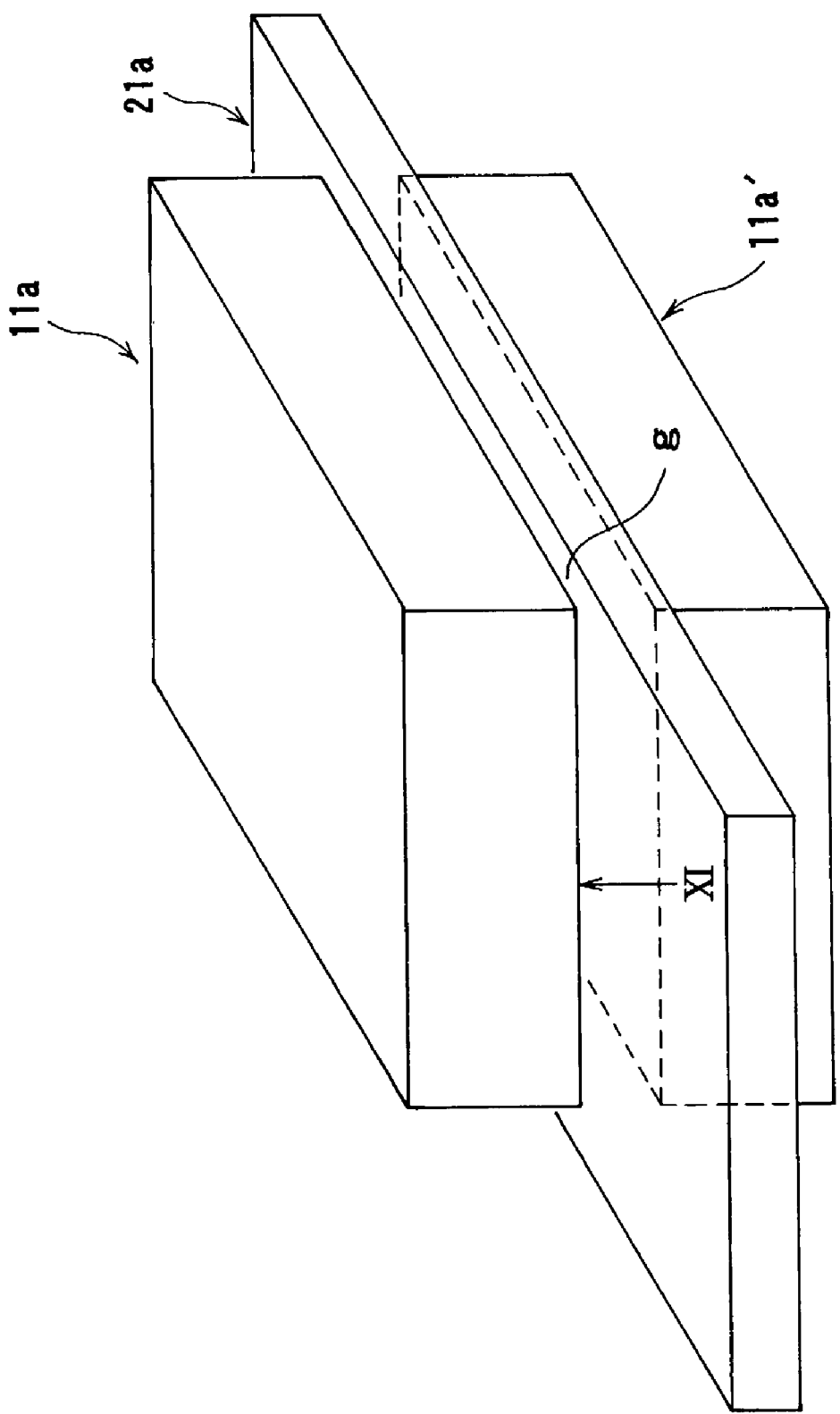
FIG. 9 is a perspective view showing the entire structure of a housing and a slider of the differential pumping seal apparatus according to the fourth embodiment of the present invention.
Figure 11:
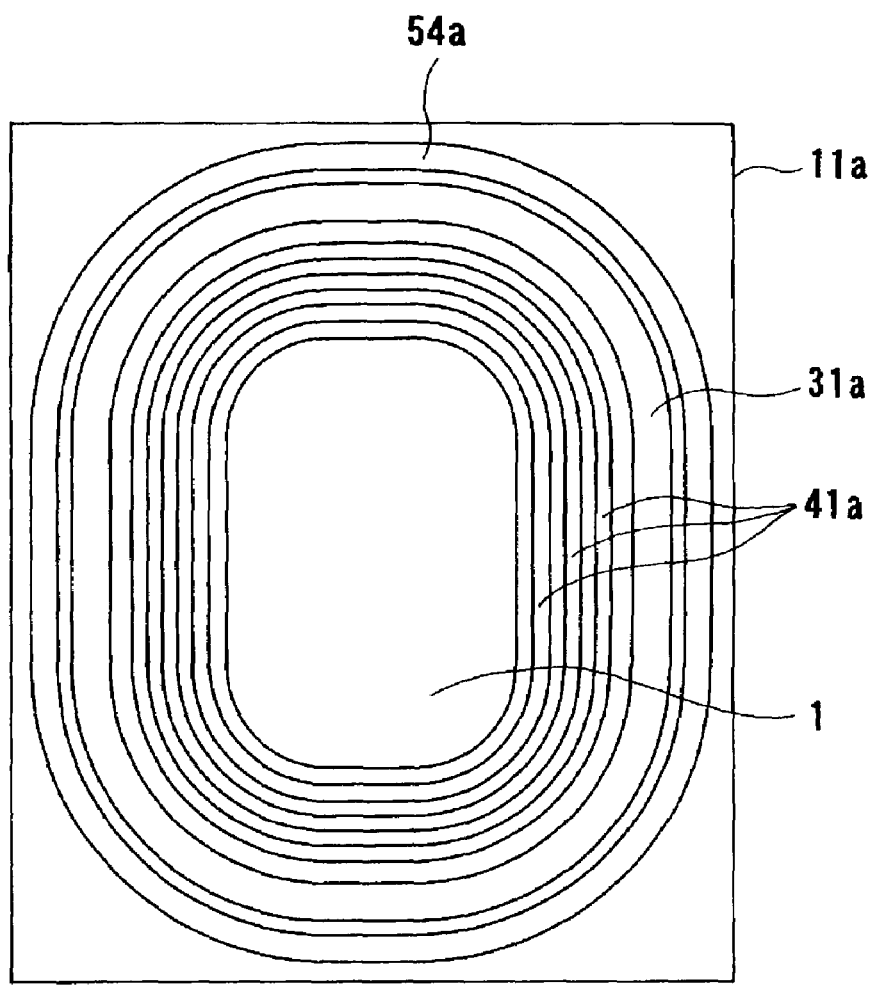
FIG. 11 is a view as viewed in the direction of the arrow XI in FIG.9.

The lower surface 14$a$ of the housing 11$a$ has a groove 31$a$ which provides a hydrostatic bearing 30$a$ positioned near the second space 2. As shown in FIG. 11, the groove 31$a$ extends in a track-like (loop-like) shape such as a rectangle, an oval or a circle so that the groove 31$a$ fully surrounds the first space 1. The shape of the groove 31$a$ depends on the shape of the first space 1. In FIG. 8, only a portion of the groove 31$a$ is shown. The groove 31$a$ is connected to a supply source 35$a$ for supplying clean air or a clean inert gas via a valve 32$a$, and hence the clean air or the clean inert gas can be supplied from the supply source 35$a$ into the groove 31$a$. The lower surface 14$a$ also has a plurality of grooves 41$a$ (three in the present embodiment) which provide a differential pumping seal 40$a$ and are formed between the groove 31$a$ and the first space 1. As shown in FIG. 11, the grooves 41a extend in a track-like (loop-like) shape such as a rectangle, an oval or a circle so that the grooves 41a fully surround the first space 1. The grooves 41a are connected to a vacuum source 45a such as a vacuum container or a vacuum pump via a valve 42a, and thus a gas flowing through the gap "g" is evacuated from the grooves 41a by the vacuum source 45a.

A diaphragm seal member 54a is disposed on the lower surface 14a at a position between the groove 31a of the hydrostatic bearing 30a and an outer surface of the side wall 12a. As shown in FIG. 11, the diaphragm seal member 54a extends in a loop-like shape such as a rectangle, an oval or a circle so that the diaphragm seal member 54a fully surrounds the first space 1. Both side edge portions of the diaphragm seal member 54a are fixed to the lower surface 14a by a known means. The lower surface 14a has a fluid passage 53a which opens at a substantially central position of the diaphragm seal member 54a. The fluid passage 53a is connected to a fluid supply source 55a for supplying a fluid via a valve 52a. When no fluid is supplied to the fluid passage 53a, the diaphragm seal member 54a is held in the flat shape and is brought into contact with the lower surface 14a as shown in FIG. 8. The diaphragm seal member 54a is made of resin or rubber containing fluorine, silicon, or butyl acetate.

Figure 10:
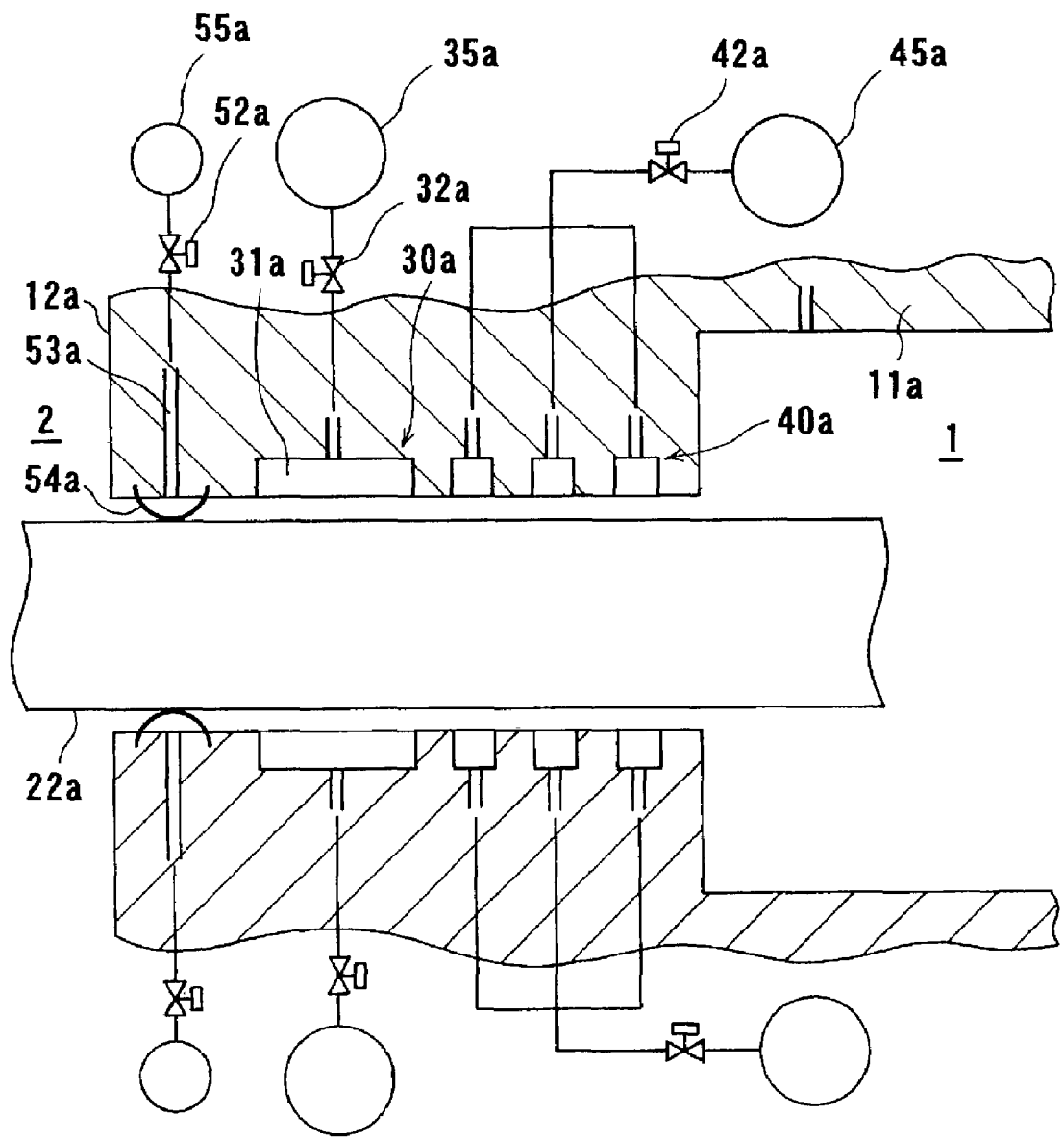
FIG. 10 is a partially cross-sectional view showing a different operational state of the differential pumping seal apparatus shown in FIG. 8.

The operations of the hydrostatic bearing 30a and the differential pumping seal 40a is in the same manner as those of the previous embodiment. When the valve 32a of the hydrostatic bearing 30a is closed and the supply of the clean air or the clean inert gas into the groove 31a is stopped and/or has been stopped, the valve 42a of the differential pumping seal 40a is closed, whereby the evacuation of the clean air or the clean inert gas in the gap "g" from the grooves 41a is stopped. At the same time that or immediately after the valve 32a is closed, the valve 52a is opened and the fluid is introduced from the supply source 55a through the fluid passage 53a to the backside of the diaphragm seal member 54a. Therefore, as shown in FIG. 10, the diaphragm seal member 54a is deformed in such a manner that the central portion of the diaphragm seal member 54a projects toward the slider 21a and is brought into contact with the outer surface 22a of the slider 21a. Consequently, the communication between the first space 1 and the second space 2 through the gap "g" is interrupted by the diaphragm seal member 54a. Other operational details of the differential pumping seal apparatus are identical to those of the differential pumping seal apparatus according to the third embodiment.

Figure 12:
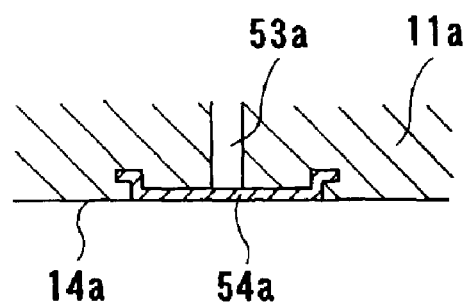
FIG. 12 is an enlarged cross-sectional view showing a modification of a manner by which a diaphragm seal member is mounted in position.

In the embodiment shown in FIG. 8, the diaphragm seal member 54a is provided on a portion of the lower surface 14a positioned in the same plane as the lower surface 14a. However, as shown in FIG. 12, the diaphragm seal member 54a may be provided on a recessed portion of the lower surface 14a having a depth equal to the thickness of the diaphragm seal member 54a, so that the outer surface of the diaphragm seal member 54a and the lower surface 14a are in the same plane.

Further, the principles of the seal member according to the fourth embodiment may be applied to the differential pumping seal apparatus according to the third embodiment, and the principles of the seal member according to the third embodiment may be applied to the differential pumping seal apparatus according to the fourth embodiment.

Figure 13:
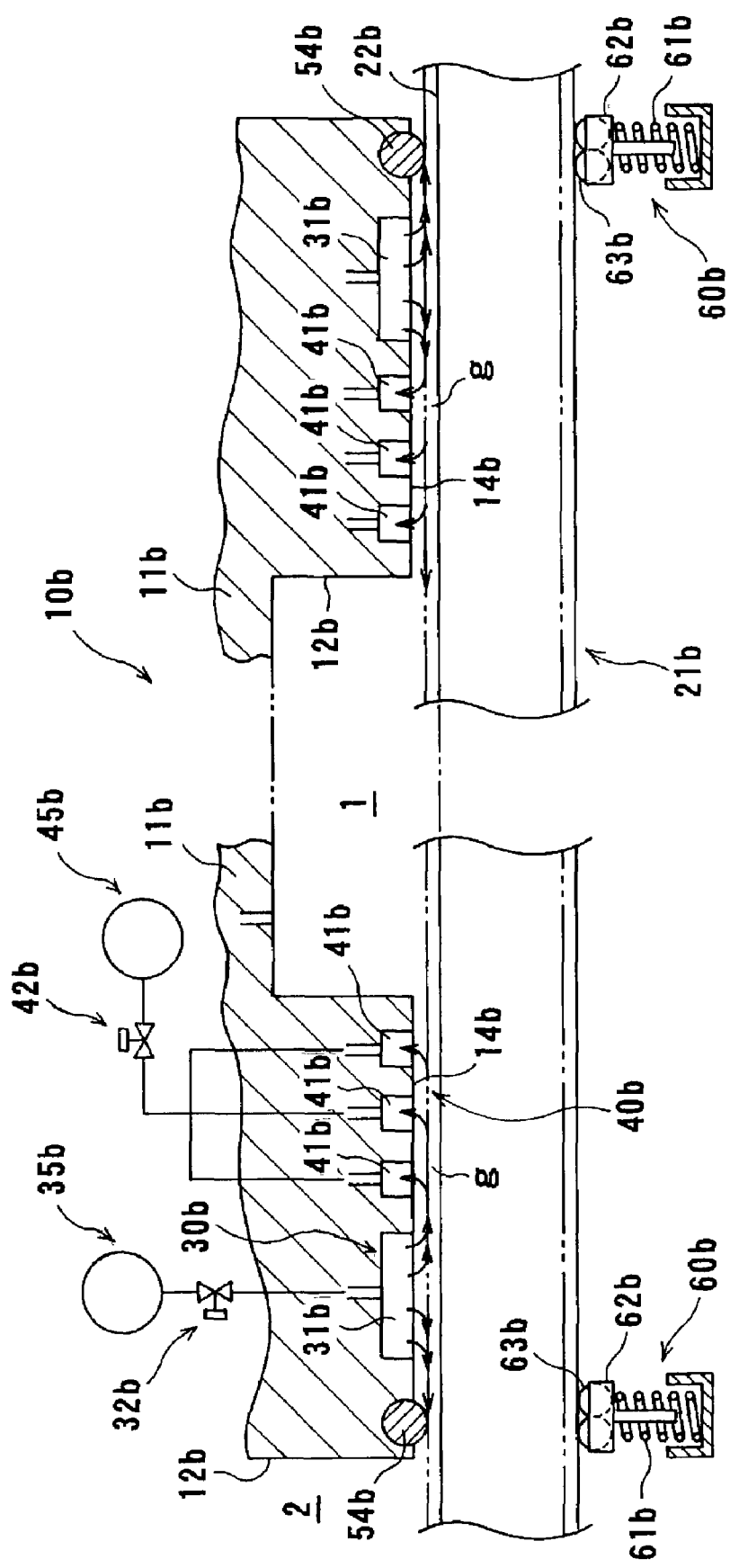
FIG. 13 is a partially cross-sectional view showing a differential pumping seal apparatus according to a fifth embodiment of the present invention.

FIG. 13 shows a differential pumping seal apparatus according to a fifth embodiment of the present invention. Those parts of the differential pumping seal apparatus according to the fifth embodiment which are identical to those of the differential pumping seal apparatus according to the third embodiment are denoted by identical reference numerals with a suffix "b". Structurally and functionally identical parts will not be described in detail below, and only different parts will be described below.

In FIG. 13, reference numeral 11b represents a first member which defines a first space 1 which serves as a clean space. An outer, peripheral side of the first member 11b faces a second space, e.g., a space 2 which is at atmospheric pressure, and the atmosphere in the space 2 is different from the atmosphere in the first space 1 (in terms of a pressure, cleanliness, type of a filled gas, and the like). In the present embodiment, the housing is disposed at only one side of the slider 21b (above the slider 21b in FIG. 13). An actuating mechanism for moving the slider 21b is disposed in the second space 2 so that an object such as a specimen is moved by the slider 21b in the first space 1.

In the present embodiment, the housing 11b has a side wall 12b extending annularly (rectangularly in the case where the housing has a rectangular shape, and circularly in the case where the housing has a circular shape) in such a manner that the side wall 12b surrounds the first space 1 above the slider 21b. The side wall 12b has a lower surface 14b spaced from the slider 21b by a desired distance over the outer surface of the slider 21b. A gap "g" having a desired dimension, e.g., in the range from about 5 to 50 μm, is formed between the lower surface 14b and the slider 21b, so that the slider 21b can be moved without contacting the housing 11b.

The lower surface 14b of the housing 11b has a groove 31b which provides a hydrostatic bearing 30b and a plurality of grooves 41b (three in the present embodiment) which provide a differential pumping seal 40b in the same manner as the third embodiment. A fixed seal member 54b is fixed to the lower surface 14b at a position between the groove 31b of the hydrostatic bearing 30b and the outer peripheral surface of the side wall 12b and projects from the lower surface 14b. The fixed seal member 54b is not deformed into contact with the slider 21b by being subjected to a fluid pressure, but is operated in the different manner from the previous embodiments. Specifically, the fixed seal member 54b has a function to be brought into contact with the slider 21b without being subject to a fluid pressure, and hence has a function to be brought into contact with the slider 21b when the slider 21b is pushed toward the housing 11b, as described later on. Specifically, the fixed seal member may comprise O-ring seal having a circular cross-section. Alternatively, the fixed seal member may comprise any of various other seal members having a different shape insofar as such seal member has the above function. In FIG. 13, only two fixed seal members 54b are shown as being disposed on the left and right portions of the lower surface 14b. Since the side wall 12b is formed in surrounding relation to the first space 1, the fixed seal member 54b extends in a loop-like shape such as a rectangle, an oval or a circle so that the fixed seal member 54b fully surrounds the first space 1. The fixed seal member 54b is made of resin or rubber containing fluorine, silicon, or butyl acetate.

A push device 60b is disposed below the slider 21b at a position corresponding to a position of the fixed seal member 54b which is spaced from the push device 60b in the direction in which the slider 21b is movable. The push device 60b has a plunger 62b elastically biased toward the housing 11b by a spring 61b. Rollers 63b are rotatably mounted on the upper end of the plunger 62b by a known means, and is held in contact with the lower surface of the slider 21b. Therefore, the slider 21b is linearly movable in a reciprocating manner to the left or right in FIG. 13, while the slider 21b is being in contact with the rollers 63b.

In the differential pumping seal apparatus having the above structure, the operation of the hydrostatic bearing 30b and the differential pumping seal 40b is in the same manner as those of the differential pumping seal apparatus according to the previous embodiments. Specifically, when the valve 32b is opened and the clean air or the clean inert gas is supplied from the supply source 35b into the groove 31b of the hydrostatic bearing 30b, the clean air or the clean inert gas flows from the groove 31b into the gap "g", thus pushing the slider 21b away from the housing 11b against the urging force of the spring 61b of the push device 60b. The slider 21b is thus held out of contact with the fixed seal member 54b fixed to the lower surface 14b of the housing 11b (in a non-contact manner). Therefore, the slider 21b can smoothly be reciprocated by the non-illustrated actuating mechanism without contacting the housing 11. Most of the clean air or the clean inert gas which has flowed into the gap "g" flows from the grooves 41b of the differential pumping seal 40b to the vacuum source 45b via the valve 42b, and part of the remaining clean air or the remaining clean inert gas flows into the second space 2 which is at atmospheric pressure. Therefore, only a trace amount of the clean air or the clean inert gas flows into the first space 1 which serves as a clean space. In this state, the first space 1 and the second space 2 are separated from each other by an invisible wall (a non-contact seal or a differential pumping seal).

In the present embodiment, one of the three grooves 41b which is close to the first space 1 may be used as a purge gas port for supplying a purge gas, instead of being used as a groove for discharging the clean air or the clean inert gas.

When the valve 32b of the hydrostatic bearing 30b is closed and the supply of the clean air or the clean inert gas into the groove 31b is stopped and/or has been stopped, the valve 42b of the differential pumping seal apparatus 40b is closed to stop discharging the clean air or the clean inert gas in the gap "g" from the grooves 41b. Therefore, the fluid pressure developed in the gap "g" is released, and the slider 21b is pushed toward the housing 11b by the urging force of the spring 61b of the push device 60b, as indicated by the two-dot-and-dash lines in FIG. 13, whereby the upper surface 22b of the slider 21b is brought into close contact with the fixed seal member 54b. Consequently, the communication between the first space 1 and the second space 2 through the gap "g" is interrupted by the fixed seal member 54b. The degree of vacuum or the degree of cleanliness in the second space 2 is slightly lowered from the level that is achieved when the differential pumping seal 40b is in operation, but is not lowered enough to obstruct the operation of an apparatus having the differential pumping seal apparatus.

According to the present invention, since the differential pumping seal apparatus has the diaphragm seal member operated by a fluid pressure or the fixed seal member which functions when one member is pushed against the other member by the push devices, an apparatus such as a semiconductor fabrication apparatus having a non-contact seal typified by a differential pumping seal can be trouble-free. Specifically, the cleanliness in the clean space (vacuum chamber) can be maintained when the apparatus is shut off in case of emergency or is brought out of operation, and a vacuum can quickly be achieved after the apparatus is started to operate again.

Although certain preferred embodiments of the present invention have been shown and described in detail, it should be understood that various changes and modifications may be made therein without departing from the scope of the appended claims.

What is claimed is:

1. A differential pumping seal apparatus for use in a semiconductor fabrication apparatus, said apparatus comprising:
   a hydrostatic bearing comprising a working fluid supply source;
   a differential pumping seal for sealing a first space and a second space from each other in a non-contact manner so as to prevent fluid communication between the first space and the second space, a pressure of the first space being lower than a pressure of the second space;
   wherein during operation of said differential pumping seal, said working fluid supply source is maintained at a pressure greater than the pressure of said differential pumping seal, and
   a back up seal mechanism for sealing said first space and said second space from each other in a contact manner;
   wherein said back up seal mechanism, said hydrostatic bearing and said differential pumping seal are arranged in this order in a direction from the second space to the first space, and said back up seal mechanism seals said first space and said second space from each other only when operation of said differential pumping seal is stopped or while operation of said differential pumping seal is stopped.

2. A differential pumping seal apparatus according to claim 1, wherein said back up seal mechanism comprises a seal member for sealing said first space and said second space from each other, and said seal member is kept in a non-contact state by the force of a fluid or an external force so as not to perform a sealing function thereof when said differential pumping seal is in operation, and said seal member is kept in a contact state by its own elasticity or an external force so as to perform the sealing function thereof when said differential pumping seal is not in operation.

3. A differential pumping seal apparatus for use in a semiconductor fabrication apparatus said apparatus comprising:
   a partition wall for dividing a first space and a second space from each other;
   a movable body provided so as to pass through said partition wall;
   a hydrostatic bearing comprising a working fluid supply source;
   a differential pumping seal for sealing said first space and said second space from each other in a non-contact manner so as to prevent fluid communication between the first space and the second space, a pressure of the first space being lower than a pressure of the second space;
   wherein during operation of said differential pumping seal, said working fluid supply source is maintained at a pressure greater than the pressure of said differential pumping seal, and
   a back up seal mechanism for closing a gap between said partition wall and said movable body in a contact manner so as to seal said first space and said second space from each other;
   wherein said back up seal mechanism, said hydrostatic bearing and said differential pumping seal are arranged in this order in a direction from the second space to the first space, and said back up seal mechanism seals said first space and said second space from each other only when operation of said differential pumping seal is stopped or while operation of said differential pumping seal is stopped.

4. A differential pumping seal apparatus according to claim 3, wherein said back up seal mechanism has a shutter mechanism for opening and closing the gap between said partition wall and said movable body, and said shutter mechanism is operated to seal said first space and said second space from each other only when operation of said differential pumping seal is stopped or while operation of said differential pumping seal is stopped.

5. A differential pumping seal apparatus according to claim 3, wherein said back up seal mechanism has a seal member provided on said partition wall or said movable body, and said seal member is brought into contact with said partition wall or said movable body by its own elasticity so as to perform a sealing function thereof when said differential pumping seal is not in operation, and said seal member is kept out of contact with said partition wall or said movable body by the force of a fluid so as not to perform the sealing function thereof when said differential pumping seal is in operation.

6. A differential pumping seal apparatus for use in a semiconductor fabrication apparatus, said apparatus comprising:
a first member for defining at least one of a first space and a second space whose atmospheres are different from each other;
a second member movable relatively to said first member;
a hydrostatic bearing comprising a working fluid supply source;
a differential pumping seal for sealing a gap between said first space and said second space in a non-contact manner so as to prevent fluid communication between the first space and the second space, a pressure of the first space being lower than a pressure of the second space;
wherein during operation of said differential pumping seal, said working fluid supply source is maintained at a pressure greater than the pressure of said differential pumping seal, and
a seal element for separating said first space and said second space from each other in a contact manner only when said differential pumping seal does not function;
wherein said seal element, said hydrostatic bearing and said differential pumping seal are arranged in this order in a direction from the second space to the first space, and said seal element comprises a diaphragm seal member which is extensible and has an edge portion fixed to said first member, and said diaphragm seal member projects toward said second member by a fluid pressure so as to be brought into contact with said second member.

7. A differential pumping seal apparatus according to claim 6, wherein said gap is formed on both sides of said first space, and said differential pumping seal for sealing said gap is provided at a position where said second member passes through said first member.

8. A differential pumping seal apparatus according to claim 6, further comprising:
the hydrostatic bearing performs the bearing function in said gap;
said hydrostatic bearing and said differential pumping seal being adjacent to each other in said gap, said hydrostatic bearing being disposed at a position where said hydrostatic bearing is closer to said second space than said differential pumping seal, and said seal element being disposed between said hydrostatic bearing and said second space.

9. A differential pumping seal apparatus for use in a semiconductor fabrication apparatus, said apparatus comprising:
a first member for defining at least one of a first space and a second space whose atmospheres are different from each other;
a second member movable relatively to said first member;
a hydrostatic bearing comprising a working fluid supply source;
a differential pumping seal for sealing a gap between said first space and said second space in a non-contact manner so as to prevent fluid communication between the first space and the second space, a pressure of the first space being lower than a pressure of the second space, said gap being formed only on one side of said second member, one of said first and second spaces being defined by said first member and said second member;
wherein during operation of said differential pumping seal, said working fluid supply source is maintained at a pressure greater than the pressure of said differential pumping seal,
a seal element for separating said first space and said second space from each other in a contact manner only when said differential pumping seal does not function, said seal element comprising a fixed seal member which is fixed to said first member and is capable of being brought into contact with said second member; and
a push device for pushing said second member toward said first member to bring said second member into contact with said fixed seal member only when said differential pumping seal does not function
wherein said seal element, said hydrostatic bearing and said differential pumping seal are arranged in this order in a direction from the second space to the first space.

10. A differential pumping seal apparatus according to claim 9, further comprising:
the hydrostatic bearing performs the bearing function in said gap;
said hydrostatic bearing and said differential pumping seal being adjacent to each other in said gap, said hydrostatic bearing being disposed at a position where said hydrostatic bearing is closer to said second space than said differential pumping seal, and said seal element being disposed between said hydrostatic bearing and said second space.

* * * * *